United States Patent [19]

Sakurai et al.

[11] Patent Number: 4,508,814

[45] Date of Patent: Apr. 2, 1985

[54] WATERLESS NEGATIVE OR POSITIVE LITHOGRAPHIC PRINTING PLATE PREPARATION

[75] Inventors: Kiyomi Sakurai, Neyagawa; Seiji Arimatsu, Kyoto, both of Japan

[73] Assignee: Nippon Paint Co., Ltd., Osaka, Japan

[21] Appl. No.: 396,476

[22] Filed: Jul. 8, 1982

[30] Foreign Application Priority Data

Jul. 9, 1981 [JP] Japan ................................. 56-107833

[51] Int. Cl.$^3$ ........................... G03F 7/08; G03F 7/10; G03F 7/00
[52] U.S. Cl. .................................... 430/303; 430/162; 430/175; 430/176; 430/270; 430/281; 430/285; 430/300; 430/309; 430/325; 430/326
[58] Field of Search ............... 430/303, 302, 300, 309, 430/325, 326, 145

[56] References Cited

U.S. PATENT DOCUMENTS

| | | | |
|---|---|---|---|
| 3,790,382 | 2/1974 | Dahlman | 430/302 |
| 3,901,700 | 8/1975 | Yoerger et al. | 430/303 |
| 3,910,187 | 10/1975 | Cords | 430/303 |
| 3,953,212 | 4/1976 | Miyano et al. | 430/303 |
| 3,997,349 | 12/1976 | Sanders | 430/303 |
| 4,224,398 | 9/1980 | Muzyczko et al. | 430/286 |
| 4,294,905 | 10/1981 | Okishi et al. | 430/286 |

FOREIGN PATENT DOCUMENTS

| | | | |
|---|---|---|---|
| 2023858 | 1/1980 | United Kingdom | 430/145 |
| 2081919 | 2/1982 | United Kingdom | 430/145 |

*Primary Examiner*—Charles L. Bowers, Jr.
*Attorney, Agent, or Firm*—Wenderoth, Lind & Ponack

[57] ABSTRACT

A photosensitive plate suitable for preparation of a waterless lithographic printing plate, which comprises a support material and a photosensitive layer provided thereon, said photosensitive layer being made of a photosensitive composition comprising an emulsion polymerization product of an acrylic or methacrylic monomer having a perfluoroalkyl group in the side chain and a water-soluble photosensitive substance resin whose water-solubility is variable by irradiation of ultraviolet rays.

18 Claims, 4 Drawing Figures

WATERLESS NEGATIVE OR POSITIVE LITHOGRAPHIC PRINTING PLATE PREPARATION

The present invention relates to a waterless lithographic printing plate and its preparation. More particularly, it relates to a photosensitive plate suitable for preparation of a waterless lithographic printing plate and a waterless lithographic printing plate prepared therefrom.

In printing with a lithographic printing plate, an oleophilic image is formed on a hydrophilic surface of the printing plate; and dampening water is placed on the non-image part and an ink is placed on the image part. When the amount of the dampening water applied on the plate surface is too small, the ink attaches also to the non-image part to cause staining of the printing paper. When the amount of the dampening water is too large, the attachment of the ink on the image part becomes insufficient to cause faintness of the printed image and also the ink is emulsified to stain the printing paper. Besides, dampening water is transferred to the printing paper to cause its expansion or contraction, which produces troublesome problems, particularly in multi-color printing. Thus, the use of dampening water provides various unfavorable influences.

In order to provide lithographic printing plates not requiring dampening water, a variety of studies have been made, among which the most practical one is based on the utilization of the oil-repellent property of silicone resin. In such case, however, the use of certain special organic solvents is required for development of an image.

As a result of the extensive studies, it has been found that a printing plate prepared by the use of a photosensitive composition comprising an emulsion polymerization product of an acrylic or methacrylic monomer having a perfluoroalkyl group in the side chain and a water-soluble photosensitive substance whose water-solubility is variable due to irradiation by ultraviolet rays is quite suitable for lithographic printing without employing dampening water.

According to the present invention, there is provided a photosensitive plate suitable for the preparation of a waterless lithographic printing plate, which comprises a support material and a photosensitive layer provided thereon, said photosensitive layer being made of a photosensitive composition comprising an emulsion polymerization product of an acrylic or methacrylic monomer having a perfluoroalkyl group in the side chain and a water-soluble photosensitive substance whose water-solubility is variable when irradiated with ultraviolet rays.

For development of an image on the photosensitive layer of the photosensitive plate of the invention, there may be adopted any of the following two procedures. In the first procedure, water is applied on the plate surface after exposure, and the surface is scrubbed with a cloth so as to wash out the photosensitive layer of the non-exposed portion to make an image. In this case, the amount of the water-soluble photosensitive substance to the emulsion polymerization product is made relatively small so that the exposed and hardened portion acquires ink-repellent properties. Thus, the exposed portion becomes the non-image part and the non-exposed portion becomes the image part, i.e. the ink-accepting part. The resulting printing plate is of positive type.

In the second procedure, the plate surface after exposure is immersed into water and subjected to vat development without being scrubbed so as to extract with water only the water-soluble photosensitive substance in the photosensitive layer of the non-exposed portion. As a result, the non-exposed portion essentially consists of the emulsion polymerization product, and the exposed and hardened portion comprises a mixture of the emulsion polymerization product and the water-soluble photosensitive substance. In this case, the amount of the water-soluble photosensitive substance to the emulsion polymerization product is made relatively large so that the exposed and hardened portion becomes the ink-accepting part. Thus, the exposed portion becomes the image part, and the non-exposed portion becomes the non-image part. The resultant printing plate is a negative type.

As understood from the above, it is the characteristic feature of the photosensitive plate of the invention that it can provide a positive type printing plate and a negative type printing plate by changing the proportion of water-soluble photosensitive substance to the emulsion polymerization product.

It has heretofore been proposed to utilize fluorine resin films as the material for the preparation of waterless lithographic printing plates (e.g. Japanese Patent Publications (unexamined) Nos. 56302/1976, 30003/1976, 30002/1976, 28003/1976, 89103/1975). In these proposals, however, the formation of an image part to which an ink attaches is achieved by destruction of the fluorine resin film according to any physical means such as by a discharge treatment, a scratching treatment, a heat treatment, or by type printing or drawing. These procedures can hardly provide an image with high resolving power and can not produce multi-color printing plates. In the present invention, the image formation is effected by the photo-engraving method, and the photosensitive plate may be handled in quite the same manner as in case of conventional presensitized plates or wipe-on plates. Further, the printing plate after exposure can be developed simply by treatment with water.

The support material is usually in a sheet or plate form and may be made of metals (e.g. iron aluminum), plastics (e.g. polyester, nylon), fibrous materials (e.g. paper), etc.

The emulsion polymerization product of an acrylic or methacrylic monomer having a perfluoroalkyl group in the side chain, especially at the end of the side chain (hereinafter referred to as "fluorine resin"), can be obtained by emulsion polymerization of such perfluoroalkyl-bearing monomer, if necessary, with at least one of other copolymerizable monomers, by a conventional procedure. The reaction mixture obtained as the result of the emulsion polymerization and comprising the fluorine resin as the reaction product may be employed as such without further treatment. Such emulsion polymerization product, i.e. the fluorine resin, is commercially available, and examples of the ones now in the markets are "ASAHI GUARD AG-710" (manufactured by Asahi Glass Co., Ltd.), "ASAHI GUARD PA-550" (manufactured by Asahi Glass Co., Ltd.), "DICGURARD F-60" (manufactured by Dainippon Ink and Chemicals, Inc.), "DICGURARD F-70" (manufactured by Dainippon Ink and Chemicals, Inc.), "SCOTCH GUARD FC-282" (manufactured by Sumitomo 3M), "ZEPEL B" (manufactured by E. I. DuPont), etc. Examples of the perfluoroalkyl-bearing monomer are (perfluoronynyl)ethyl acrylate, (perfluorononyl)ethyl methacrylate, (perfluoroisononyl)ethyl acrylate, (perfluoroisononyl)ethyl methacrylate, (perflurooctyl)ethyl acrylate, (perfluorooctyl)ethyl methacrylate, (perfluoroheptyl)ethyl acrylate, (perfluoroheptyl)ethyl methacrylate, etc. Examples of the other copolymerizable monomer include styrene, acrylonitrile, acrylic acid and methacrylic acid, and their esters such as alkyl esters (e.g. methyl ester, ethyl ester, propyl ester, butyl ester, isobutyl ester, 2-ethylhexyl ester, hexyl ester, decyl ester, lauryl ester, stearyl ester), hydroxyalkyl esters (e.g. β-hydroxyethyl ester) and glycidyl ester. The proportion of these monomers may be optionally selected, but the amount of the perfluoroalkyl-bearing monomer should be not less than 50% by weight on the basis of the amount of the entire monomers. When the amount is less than 50% by weight, the ink-repellent property of the printing plate as the ultimate product is inferior. The use of the other copolymerizable monomer may be effective in improving a close adherence between the support material and the photosensitive layer, as well as the storage stability of the photosensitive plate, the wear-resistance of the printing plate, etc.

As the water-soluble photosensitive substance, there may be employed any one which is soluble in water, has film-forming properties and becomes water-insoluble by light-irradiation. Specific examples are diazo resins (i.e. condensates of diazonium salts such as p-diazodiphenylamine with formaldehyde or paraformaldehyde), polyvinyl alcohols or partially saponified polyvinyl acetates having water-soluble photosensitive groups (e.g. a styrylpyridinium salt), a mixture of a water-soluble binder (e.g. partially saponified polyvinyl acetate) and a water-soluble acrylic monomer (e.g. 2-hydroxyethyl acrylate, 2-hydroxyethyl methacrylate, 2-hydroxypropyl acrylate, 2-hydroxypropyl methacrylate, polyethylene glycol diacrylate, polyethylene glycol dimethacrylate), a water-soluble oligomer derived from said acrylic monomer, propylene glycol diglycidyl ether, ethylene glycol diglycidyl ether or the like, etc. When the printing plate is employed as of negative type, the water-soluble photosensitive substance preferably has a relatively low molecular weight in order to ensure its easy extraction at the non-exposed portion, and thus a diazo resin in favorably employed.

In addition to the said essential components, i.e. the fluorine resin and the water-soluble photosensitive substance, the photosensitive composition may comprise optionally conventional additives. For example, silicone resins (e.g. silicone emulsion) may be incorporated into the photosensitive composition for improvement of the ink-repellent properties. Further, for example, dyes may be incorporated for visualization of the image.

The weight proportion of the fluorine resin and the water-soluble photosensitive substance in the photosensitive composition may be 100:0.5-500, preferably 100:1-400. When the amount of the water-soluble photosensitive substance is relatively small within said range, the ultimately produced printing plate may be of positive type. When its amount is relatively large, a negative type printing plate will be obtained. The transfer from the positive type to the negative type is dependent on the ink-repellent properties of the fluorine resin, the kind of the water-soluble photosensitive substance, the film thickness of the photosensitive layer, the degree of roughness at the surface of the printing plate, the kind of the printing ink, the printing conditions (e.g. printing speed, printing pressure and temperature), etc. For example, in case of obtaining a positive type printing plate in which non-adherence of an ink to the exposed and hardened portion is required, the water-soluble photosensitive substance may be used in an amount of 0.5 to 20 parts by weight to 100 parts by weight of the fluorine resin. When its amount exceeds 20 parts by weight but remains under the upper limit of 500 parts by weight, adherence of the ink to the hardened portion takes place so that the resulting printing plate may be used as a negative type. The boundary value of 20 parts by weight is shown only as an example and is not intended to limit the invention.

When the amount of the water-soluble photosensitive substance is smaller than the lower limit of the said range, the photosensitivity of the photosensitive layer is reduced, and the photo-curing ability is insufficient. Thus, the formation of an image becomes difficult. When its amount exceeds the upper limit, the extraction of the water-soluble photosensitive substance in the non-exposed portion with water is not achieved sufficiently, and a negative type printing plate in which the non-exposed portion is used as the non-image part is hardly obtained.

The photosensitive plate of the invention may be prepared by applying the photosensitive composition comprising the fluorine resin and the water-soluble photosensitive substance onto a support material by a conventional method and drying it, for instance, in an oven to form a photosensitive layer. The total content of the fluorine resin and the water-soluble photosensitive substance in the photosensitive composition which is aqueous, is usually from 1 to 50% by weight, preferably from 3 to 30% by weight. The thickness of the photosensitive layer is usually from 0.1 to 5 microns.

In the photosensitive plate of the invention, an adhesive layer may be provided between the support material and the photosensitive layer in order to improve their adhesion. In a photosensitive plate for the preparation of a positive type printing plate, the use of a water-soluble adhesive layer gives, as the result of development with water, the surface of the support material as the ink-accepting part. The use of a water-insoluble adhesive layer gives the surface of such layer itself as the ink-accepting part. A preferred example of a water-soluble adhesive layer is the one made of a water-soluble photosensitive substance to be used as the photosensitive layer. Such adhesive layer can be hardened together with the photosensitive layer by exposure to ensure the firm adhesion between the support material and the photosensitive layer (exposed portion). The thickness of the water-soluble adhesive layer is desired to be from 0.01 to 1 micron, preferably from 0.03 to 0.5 micron. In case of a water-insoluble adhesive layer, there is no particular limitation on its thickness.

In order to enhance the storage stability, a water-impermeable plastic film may be laminated on the photosensitive layer of the photosensitive plate so as to protect the photosensitive layer from the moisture in the atmosphere under storage. This is particularly effective when the photosensitive layer contains a diazo resin obtained by condensation of a diazonium salt with formaldehyde as the water-soluble photosensitive substance, because the diazo resin is somewhat unstable to moisture. The water-impermeable plastic film may be made of polyethylene terephthalate, polyethylene, polypropylene, polycarbonate, polystyrene or the like. For assurance of the adhesion between the photosensitive layer and the water-impermeable plastic film, any adhesive agent of hot melt type may be employed.

The concrete structures of the photosensitive plate and the printing plate obtained therefrom are shown in the accompanying drawings wherein FIG. 1 is a sectional view of an embodiment of the photosensivite plate according to the invention;

In these Figures, the numeral 1 indicates a photosensitive layer, 1-a is a particle of the fluorine resin, 1-b is a phase of the water-soluble photosensitive substance, 2 is a support material, 3 is an exposed portion (non-image part), 4 is an exposed portion (image part), 5 is a non-exposed portion (non-image part), 6 is an original film having a negative image and 7 is an original film having a positive image.

Figure 1:
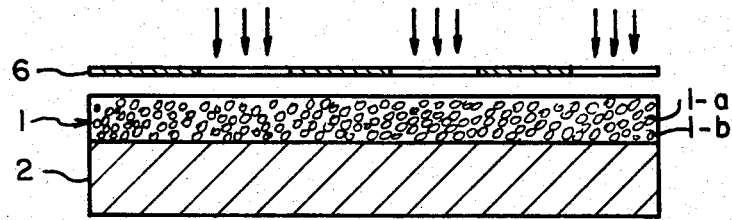
Figure 2:
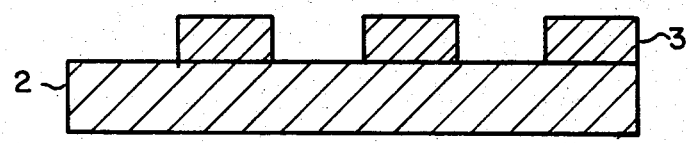
FIG. 2 is a sectional view of the printing plate obtained from the photosensitive plate of FIG. 1.

Preparation of a positive type printing plate from the photosensitive plate of the invention may be effected in a per se conventional manner. As shown in FIG. 1, the original film having a positive image 6 is brought into close contact with the photosensitive layer 1 of the photosensitive plate in a vacuum frame, and irradiation is made by the use of a chemical lamp or a high pressure mercury lamp. After the original film is eliminated, water is applied onto the surface of the resulting plate, which is then lightly scrubbed, whereby the exposed portion 3 remains as such without being dissolved in water while in the non-exposed portion, the photosensitive composition is washed out with water to leave an image (FIG. 2). In the thus formed image part, the surface of the support material is disclosed, to which an ink attaches. In the non-image part (i.e. exposed portion), the ink attachment does not take place owing to the activity of the fluorine resin. Therefore, application of dampening water to the non-image part is unnecessary for realization of printing, unlike a conventional offset printing procedure. Preferably, the above obtained printing plate is further subjected to heat treatment, whereby the particles of the fluorine resin at the non-image part are coagulated and the perfluroalkyl groups in the fluorine resin are regularly oriented so that the ink-repellent property at the part can be enhanced. The heat treatment is usually effected at a temperature of 100° to 180° C. in an oven.

Figure 3:
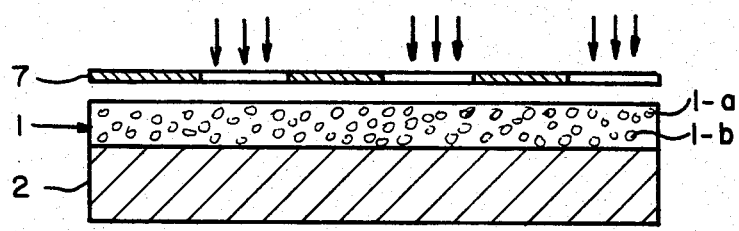
FIG. 3 is a sectional view of another embodiment of the photosensitive plate according to the invention.
Figure 4:
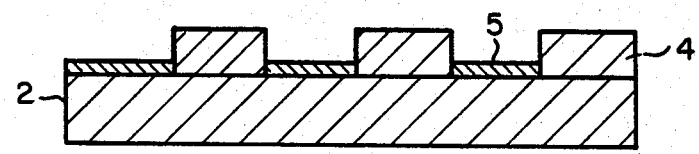
FIG. 4 is a sectional view of the printing plate obtained from the photosensitive plate of FIG. 3. The printing plates in FIGS. 2 and 4 are respectively of positive type and of negative type.

In case of a negative type printing plate, the preparation may be effected in the same manner as above. Since, however, it is necessary that the exposed portion (image part) becomes the ink-accepting part and the non-exposed portion (non-image part) acquires the ink-repellent property, an additional operation is required before or after the preparation of the printing plate. In order to avoid such additional operation, the following procedure may be adopted. Namely, as shown in FIG. 3, the original film having a negative image 7 is brought into close contact with the photosensitive layer 1 of the photosensitive plate, and irradiation is effected. Then, the original film is eliminated. On developing the plate surface, the plate is immersed into water to effect vat development, whereby the exposed portion remains as such, while in the non-exposed portion, only the water-soluble photosensitive substance in the photosensitive layer is dissolved out into water and thus extracted, but the fluorine resin remains as such. Therefore, the hardened photosensitive layer 4 remains in the exposed portion, but in the non-exposed portion, a layer essentially consisting of the fluorine resin 5 is formed to leave an image (FIG. 4). Consequently, the exposed portion contains a large amount of the water-soluble photosensitive substance so that the ink-repellent property of the fluorine resin is relatively small, and attachment of the ink takes place. To the contrary, the non-exposed portion essentially consists of the fluorine resin and thus repels the ink, so that it can become the non-image part. The thus obtained printing plate may be as such employed for printing but is preferably subjected to heat treatment for heat-coagulation of the particles of the fluorine resin and improvement of the ink-repellent property. The conditions for the heat treatment may be the same as hereinabove stated.

The present invention will be hereinafter explained further in detail by the following Examples, wherein part(s) and % are by weight unless otherwise indicated.

EXAMPLE 1

A fluorine resin emulsion ("ASAHI GUARD AG 710" manufactured by Asahi Glass Co., Ltd.) (100 g; solid content, 20%) and an aqueous solution of a diazo resin ("DIAZO No. 4L" manufactured by Fairmount Chemical Co.) (50 g; solid content, 6%) were mixed well, and the resultant mixture was, after filtration, applied to a cleaned surface of an aluminum plate by the air of a bar coater to make a photosensitive layer of about 2 microns in thickness (after drying), followed by drying at 60° C. for 1 minute to make a photosensitive plate.

On the surface of the thus obtained photosensitive plate, a film having a positive image was brought into close contact in a vacuum frame, and irradiation was effected for 1 minute by the use of a 3 KW high pressure mercury lamp from a distance of 60 cm. Then, tap water was introduced onto the plate surface, which was scrubbed lightly with cotton to wash out the non-exposed portion and dried at 130° C. for 3 minutes to give a printing plate.

When a lithographic ink was placed on the surface of the printing plate by the use of a gum roller, the ink did not adhere to the fluorine resin portion as the non-image part, but it attached only to the image part.

EXAMPLE 2

On a cleaned surface of an aluminum plate, the aqueous solution of the diazo resin ("DIAZO No. 4L") as used in Example 1 was applied by the aid of a bar coater (No. 4), and the plate was dried at 60° C. for 1 minute. On this diazo resin-coated surface, the mixture of "ASAHI GUARD AG 710" and the aqueous solution of "DIAZO No. 4L" as used in Example 1 was applied by the aid of a bar coater (No. 10), followed by drying at 60° C. for 1 minute to give a photosensitive plate.

A film having a positive image was brought into close contact to the surface of the thus obtained photosensitive plate in a vacuum frame, and irradiation was effected for 2 minutes by the use of a 3 KW high pressure mercury lamp. Tap water was flowed onto the plate surface, which was then lightly scrubbed with cotton to give a sharp image. The resulting plate was subjected to heat treatment at 130° C. for 3 minutes to give a printing plate.

When a lithographic ink was placed on the surface of the printing plate by the use of a gum roller, the ink did not attach to the non-image part, but it adhered only to the image part.

EXAMPLE 3

A fluorine resin emulsion ("DICGURARD F-60" manufactured by Dainippon Ink and Chemicals, Inc.) (10 g; solid content, 18%) and the aqueous solution of the diazo resin ("DIAZO No. 4L") as used in Example 1 (3.0 g) were mixed well, and the resultant mixture was filtered. To a clean surface of an aluminum plate, the aqueous solution of the diazo resin ("DIAZO No. 4L") as used in Example 1 was applied by the aid of a bar coater (No. 4), followed by drying at 60° c. for 1 minute. To this coated surface, the above obtained mixture was applied by the air of a bar coater (No. 10), followed by drying at 60° C. for 1 minute to give a photosensitive plate.

To the surface of the thus obtained photosensitive plate, a film having a positive image was brought into close contact in a vacuum frame, and irradiation was effected for 1.5 minutes by the use of a 3 KW high pressure mercury lamp. For development, tap water was introduced onto the plate surface, which was then lightly scrubbed with cotton, whereby a sharp image was obtained. The resulting plate was subjected to heat treatment at 130° C. for 3 minutes to give a printing plate.

When a lithographic ink was placed on the surface of the printing plate by the use of a gum roller, the ink attached to the aluminum surface as the image part, but it did not attach to the non-image part coated with the fluorine resin.

EXAMPLE 4

"ASAHI GUARD AG 710" (100 g; solid content, 20%) and the aqueous solution of "DIAZO No. 4L" (600 g; solid content, 6%) as used in Example 1 were mixed well, and the resultant mixture was, after filtration, applied to a clean surface of an aluminum plate by the aid of a bar coater (No. 10), followed by drying at 60° C. for 3 minutes to give a photosensitive plate.

To the surface of the thus obtained photosensitive plate, a film having a negative image was brought into close contact in a vacuum frame, and irradiation was effected for 2 minutes by the use of a 3 KW high pressure mercury lamp from a distance of 60 cm. Then, the plate was immersed into water in a vat and kept quietly for 1 minute to effect vat development, whereby the yellow color of "DIAZO No. 4L" in the non-exposed portion was dissolved out. Then, the plate was dried at 150° C. for 3 minutes to give a printing plate.

When a lithographic ink was placed on the surface of the printing plate by the use of a gum roller, the ink attached to the exposed portion (image part), but it did not attach to the non-exposed portion (non-image part).

EXAMPLE 5

To a cleaned surface of an aluminum plate, the aqueous solution of the diazo resin ("DIAZO NO. 4L") as used in Example 1 was applied by the aid of a bar coater (No. 4), followed by drying at 60° C. for 1 minute. "ASAHI GUARD AG 710" (100 g) and the aqueous solution of "DIAZO No. 4L" (450 g) as used in Example 1 were mixed well, and the resultant mixture was, after filtration, applied on the diazo resin-coated surface by the aid of a bar coater (No. 10), followed by drying at 60° C. for 2 minutes to give a photosensitive plate.

To the surface of the thus obtained photosensitive plate, a film having a negative image was brought into close contact in a vacuum frame, and irradiation was effected for 2 minutes by the use of a 3 KW high pressures mercury lamp. Then, vat development was effected in water for 1 minute as in Example 4, whereby "DIAZO No. 4L" in the non-exposed portion was dissolved out. Then, the plate was subjected to heat treatment at 130° C. for 3 minutes to give a printing plate.

When a lithographic ink was placed on the surface of the printing plate by the use of a gum roller, the ink attached to the exposed portion, but it did not attach to the non-exposed portion.

EXAMPLE 6

The same procedure as in Example 5 was repeated but employing "DICGURARD F-60" (10 g) as used in Example 3 and the aqueous solution of the diazo resin ("DIAZO No. 4L") (75 g) as used in Example 1 to give a printing plate. The ink attached to the exposed portion of the printing plate, but it did not attach to the non-exposed portion.

EXAMPLE 7

"ASAHI GUARD AG 710" and the aqueous solution of the diazo resin ("DIAZO NO. 4L") as used in Example 1 were mixed in a proportion as shown in Table 1 to prepare a mixture, which was applied on a degreased surface of a sand-set aluminum plate (degree of roughness of surface: Rmax=4.5$\mu$, Rz=3.2$\mu$) by the aid of a bar coater (No. 10), followed by drying at 80° C. for 3 minutes to give a photosensitive plate.

To the surface of the photosensitive plate, a film having a negative image was brought into close contact in a vacuum frame, and irradiation was effected for 1.5 minutes by the use of a 3 KW high pressure mercury lamp from a distance of 60 cm. Then, the plate was immersed into water for 30 seconds to effect vat development, whereby the yellow color of the diazo resin in the non-exposed portion was dissolved out. Then, the plate was dried at 150° C. for 3 minutes to give a printing plate.

When a lithographic ink was placed on the surface of the printing plate by the use of a gum roller, the states of ink attachment at the exposed portion and at the non-exposed portion were as shown in Table 1.

TABLE 1

| Test No. | "ASAHI GUARD AG 710" (solid content, 20%) | Aqueous solution of "DIAZO No. 4L" (solid content, 10%) | Weight proportion of aqueous solution of "DIAZO No. 4L" to "ASAHI GUARD AG 710" in terms of solid components | Inking test* Exposed portion | Non-exposed portion |
|---|---|---|---|---|---|
| 1 | 10 g | 2 g | 10:100 | N | N |
| 2 | 10 g | 4 g | 20:100 | N | N |
| 3 | 10 g | 6 g | 30:100 | N-A | N |

TABLE 1-continued

| Test No. | "ASAHI GUARD AG 710" (solid content, 20%) | Aqueous solution of "DIAZO No. 4L" (solid content, 10%) | Weight proportion of aqueous solution of "DIAZO No. 4L" to "ASAHI GUARD AG 710" in terms of solid components | Inking test* Exposed portion | Non-exposed portion |
|---|---|---|---|---|---|
| 4 | 10 g | 10 g | 50:100 | N-A | N |
| 5 | 10 g | 20 g | 100:100 | A | N |
| 6 | 10 g | 40 g | 200:100 | A | N |
| 7 | 10 g | 80 g | 400:100 | A | N |
| 8 | 10 g | 120 g | 600:100 | A | N** |

Note:
*A: the ink attached; N: the ink did not attach; N-A: the ink did not attach to the peripheral part of the exposed portion, but it attached to the central part.
**The ink attached partly.

As apparent from Table 1, the ink attaches to neither the exposed portion nor the non-exposed portion when the amount of the diazo resin as the water-soluble photosensitive substance is small, and the image can not be distinguished. When the weight proportion of the aqueous solution of "DIAZO No. 4L" to "ASAHI GUARD AG 710" in terms of the solid components is not less than 30 to 100, the ink attaches to the exposed portion. But, in case of the said proportion being 30–50 to 100, the ink-acceptability is not sufficient, and a uniform ink attachment can not be attained. In case of the said proportion being 100 or more to 100, complete ink attachment to the exposed portion takes place. With the proportion of 600 to 100, the ink attaches partly, because the extraction of the diazo resin from the non-exposed portion is insufficient. When the non-exposed portion is scrubbed on development in Tests Nos. 1 and 2, the aluminum plate surface is disclosed to become the ink-accepting part so that a positive type printing plate is provided. In Tests Nos. 5 to 7, negative type printing plates are obtained.

EXAMPLE 8

"ASAHI GUARD AG 710" (100 g; solid content, 20%) and the aqueous solution of "DIAZO No. 4L" (333 g; solid content, 6%) as used in Example 1 were mixed well, and the resultant mixture was, after filtration, applied on an anodized surface of a sand-set aluminum plate of 0.2 mm in thickness by the air of a bar coater (No. 10), followed by drying at 60° C. for 1 minute to give a photosensitive plate.

To the surface of the thus obtained photosensitive plate, a film having a negative image was brought into close contact in a vacuum frame, and irradiation was effected for 1.5 minutes by the use of a 3 KW high pressure mercury lamp from a distance of 60 cm. Then, the plate was lightly showered with tap water, whereby the yellow color of "DIAZO No. 4L" in the non-exposed portion was dissolved out. Then, the plate was dried at 150° C. for 3 minutes to give a printing plate.

The printing plate was set on a Davidson type offset printing machine, and printing was carried out without using dampening water. Even after printing of 1000 sheets of paper, no staining was observed on the paper surface.

What is claimed is:

1. A method for preparing a waterless lithographic printing plate with a photosensitive printing plate comprising a support material and a photosensitive layer provided thereon, said photosensitive layer being made of a photosensitive composition comprising a mixture of (a) an emulsion polymerization product of an acrylic or methacrylic monomer having a perfluoroalkyl group in the side chain with or without at least one of other polymerizable monomers, the content of the perfluoroalkyl group-bearing acrylic or methacrylic monomer being not less than 50% by weight, and (b) a film-forming, water-soluble photosensitive substance which is rendered water-insoluble by irradiation with ultra-violet rays in an aqueous medium, the weight proportion of the emulsion polymerization product (a) and the photosensitive substance (b) being 100:0.5–500 in terms of the solid components and the total content of the emulsion polymerization product (a) and the photosensitive substance (b) in the photosensitive composition being from 1 to 50% by weight in terms of the solid components, which comprises the steps of (1) placing an original image film on the photosensitive layer, (2) irradiating ultraviolet rays thereto, (3) separating the irradiated plate from the image film, (4) treating the separated plate with water for washing out the photosensitive composition at the non-exposed part to make the non-exposed part as imaged and the exposed part as non-imaged, thereby producing a positive type printing plate and (5) inking the surface of the printing plate with a lithographic ink so that the ink adheres to the substrate, but does not substantially adhere to the exposed non-image part; said film-forming substance (b) being used in such small amounts in the mixture relative to component (a) that the exposed portion acquires lithographic ink repellant properties when said lithographic ink is applied to the surface thereof.

2. In a method for preparing a waterless lithographic printing plate with a photosensitive printing plate comprising a support material and a photosensitive layer provided thereon, said photosensitive layer being made of a photosensitive composition comprising a mixture of (a) an emulsion polymerization product of an acrylic or methacrylic monomer having a perfluoroalkyl group in the side chain with or without at least one of other polymerizable monomers, the content of the perfluoroalkyl group-bearing acrylic or methacrylic monomer being not less than 50% by weight, and (b) a film-forming, water-soluble photosensitive substance which is rendered water-insoluble by irradiation with ultra-violet rays in an aqueous medium, the weight proportion of the emulsion polymerization product (a) and the photosensitive substance (b) being 100:0.5–500 in terms of the solid components and the total content of the emulsion polymerization product (a) and the photosensitive substance (b) in the photosensitive composition being from 1 from 50% by weight in terms of the solid components, which comprises the steps of (1) placing an original image film on the photosensitive layer, (2) irradiating ultraviolet rays thereto, (3) separating the irradiated plate from the image film and (4') treating the separated plate with water for extracting the photosensitive substance in the photosensitive composition at the non-exposed part to make the exposed part as imaged and the non-exposed part as non-imaged, thereby producing a negative type printing plate, said film-forming substance (b) being used in large amounts relative to component (a) such that the exposed portion becomes the lithographic ink accepting part, when a lithographic ink is applied to the surface thereof.

3. A method according to claim 1 wherein a printing plate of the positive type is formed by treating the separated plate in step (4) with water by applying water onto the surface of the treating plate and lightly scrubbing the water-treated surface, thereby washing out the photosensitive composition entirely and leaving only the support surface as the image part, whereby the exposed portion, which is rendered water-insoluble as a result of said irradiation, is left on the plate as a non-imaged polymerized and raised composition having ink-repellent properties.

4. A method according to claim 2 whereby a printing plate of a negative type is formed in step (4') by immersing the separated plate in water to effect vat development, whereby the exposed portion remains as such, while in the non-exposed portion, only the water-soluble photosensitive substance is dissolved out into the water leaving only the fluorine containing polymer on said non-exposed part, said polymer having ink-repellent properties.

5. The method according to claim 1, wherein the support material is the one coated with the photosensitive substance (b).

6. The method according to claim 2, wherein the support material is the one coated with the photosensitive substance (b).

7. The method according to claim 1, wherein the photosensitive substance (b) is a diazo resin.

8. The method according to claim 2, wherein the photosensitive substance (b) is a diazo resin.

9. The method according to claim 1, wherein the weight proportion of the emulsion polymerization product (a) and the photosensitive substance (b) is 100:1-400 in terms of the solid components.

10. The method according to claim 2, wherein the weight proportion of the emulsion polymerization product (a) and the photosensitive substance (b) is 100:1-400 in terms of the solid components.

11. The method according to claim 1, wherein the weight proportion of the emulsion polymerization product (a) and the photosensitive substance (b) is 100:0.5-20 terms of the solid components.

12. The method according to claim 2, wherein the weight proportion of the emulsion polymerization product (a) and the photosensitive substance (b) is 100:20-500 in terms of the solid components.

13. The method according to claim 1, wherein a water-impermeable plastic film is provided on the surface of the photosensitive layer.

14. The method according to claim 2, wherein a water-impermeable plastic film is provided on the surface of the photosensitive layer.

15. The method according to claim 1, wherein the plate after treatment with water is further subjected to heat treatment at a temperature of 100° to 180° C.

16. The method according to claim 2, wherein the plate after treatment with water is further subjected to heat treatment at a temperature of 100° to 180° C.

17. A positive type lithographic printing plate produced according to the method of claim 11.

18. A negative type lithographic printing plate produced according to the method of claim 12.

* * * * *